(12) United States Patent
Kumagai

(10) Patent No.: US 8,156,465 B2
(45) Date of Patent: Apr. 10, 2012

(54) LAYOUT METHOD AND LAYOUT PROGRAM FOR SEMICONDUCTOR INTEGRATED CIRCUIT DEVICE

(75) Inventor: Kenji Kumagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/401,310

(22) Filed: Apr. 11, 2006

(65) Prior Publication Data

US 2007/0061769 A1     Mar. 15, 2007

(30) Foreign Application Priority Data

Sep. 9, 2005   (JP) .................................. 2005-262030

(51) Int. Cl.
*G06F 17/50* (2006.01)

(52) U.S. Cl. ....................................................... 716/122

(58) Field of Classification Search ................ 716/8–10, 716/13, 118–125

See application file for complete search history.

(56) References Cited

U.S. PATENT DOCUMENTS

| | | | | |
|---|---|---|---|---|
| 6,486,812 | B1 * | 11/2002 | Tanaka ........................... | 341/144 |
| 2004/0228066 | A1 * | 11/2004 | Sakurabayashi et al. ..... | 361/302 |
| 2005/0097492 | A1 * | 5/2005 | Matsumura et al. ............ | 716/10 |
| 2006/0026545 | A1 * | 2/2006 | Allen et al. ........................ | 716/9 |
| 2006/0117286 | A1 * | 6/2006 | Ando et al. ........................ | 716/6 |

FOREIGN PATENT DOCUMENTS

| | | | |
|---|---|---|---|
| JP | 05-152437 | * | 6/1993 |
| JP | 05-152437 A | | 6/1993 |
| JP | 05-190813 A | | 7/1993 |
| JP | 07-141413 | | 6/1995 |
| JP | 10-004141 A | | 1/1998 |
| JP | 10-242283 | | 9/1998 |
| JP | 10-256382 | | 9/1998 |
| JP | 10-283378 | | 10/1998 |
| JP | 11-134382 | | 5/1999 |
| JP | 11-338892 A | | 12/1999 |
| JP | 2004-013432 | | 1/2004 |

OTHER PUBLICATIONS

Japanese Office Action dated Oct. 28, 2008, 1 page.

* cited by examiner

*Primary Examiner* — Vuthe Siek
*Assistant Examiner* — Aric Lin
(74) *Attorney, Agent, or Firm* — Arent Fox LLP

(57) ABSTRACT

A plurality of cells are disposed in a chip region and wires are disposed between the cells in order to connect the cells over a plurality of layout steps. The layout method comprises (1) a placement restricted region placement step for disposing, in the chip region, a placement restricted region in which placement of predetermined cell types is prohibited or permitted in accordance with different layout steps, (2) a first layout step for disposing a desired cell in the chip region in conformity with the cell types that are prohibited or permitted in accordance with the first layout step of the disposed placement restricted region, and (3) a second layout step for disposing a desired cell in the chip region in conformity with the cell types that are prohibited or permitted in accordance with the second layout step of the disposed placement restricted region.

4 Claims, 12 Drawing Sheets

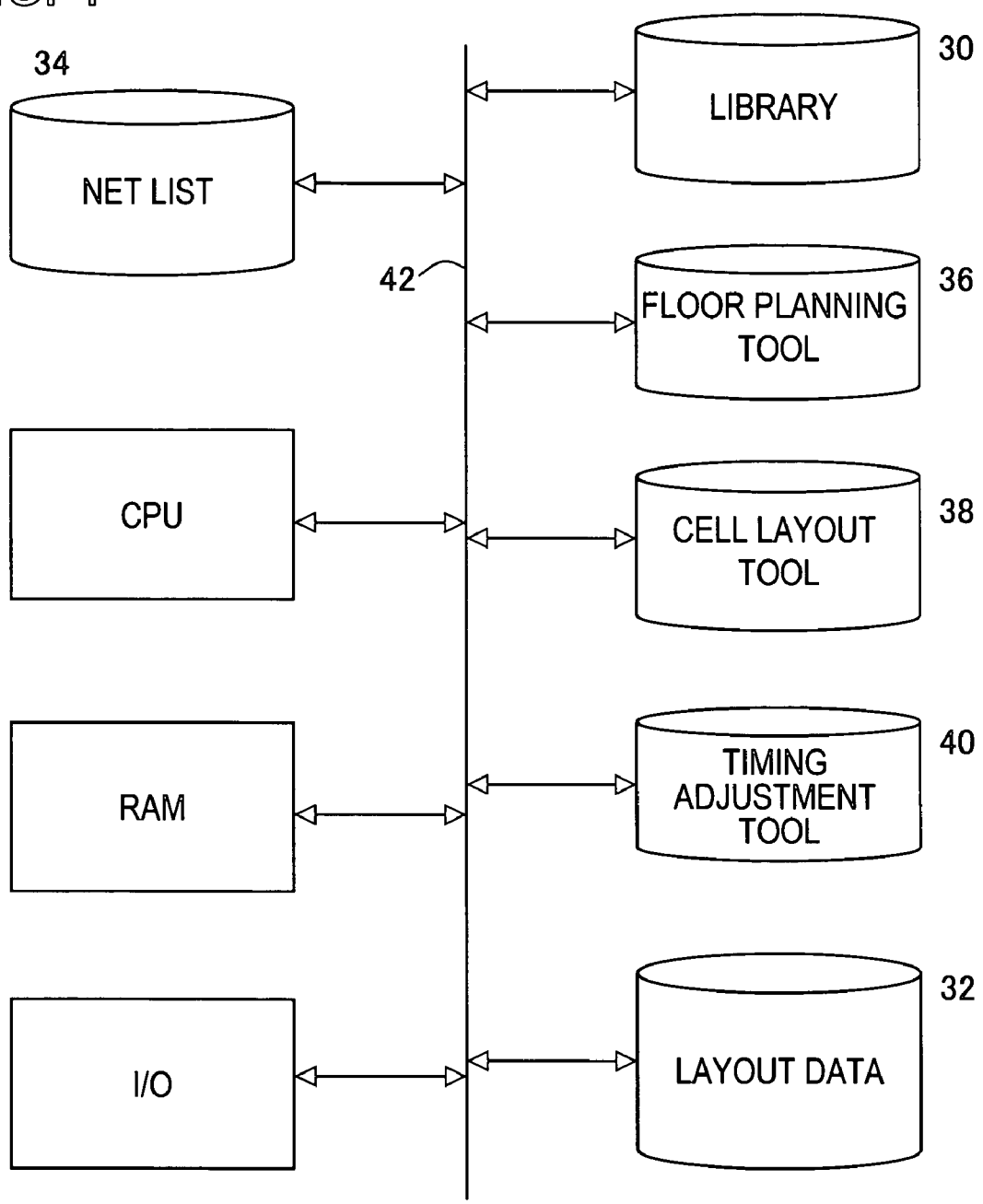

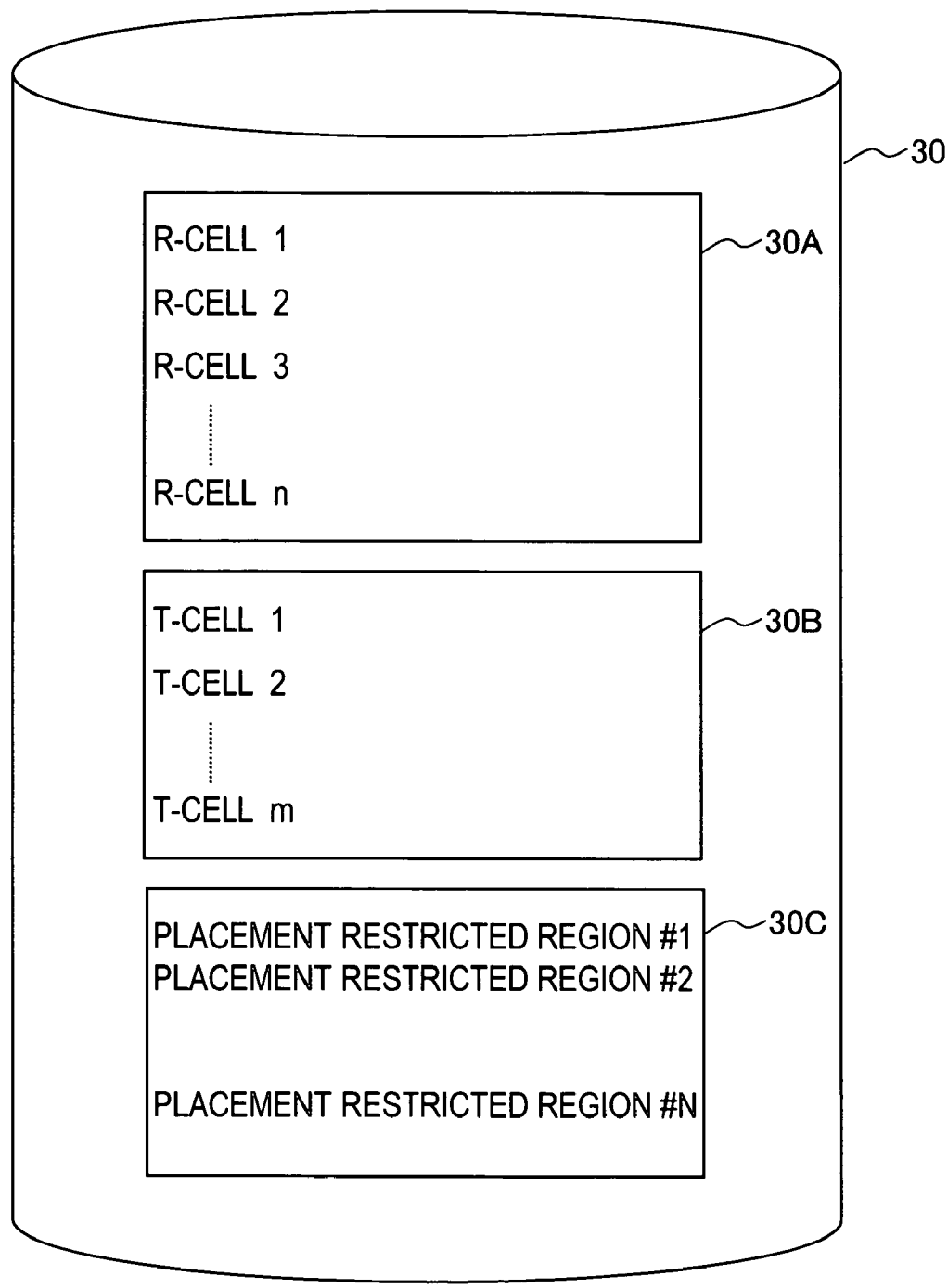
FIG. 5 EXAMPLE OF LIBRARY DATA

FIG. 6

EXAMPLE OF PLACEMENT RESTRICTED REGION DATA

| PLACEMENT RESTRICTED REGION ID | | | #1 |
|---|---|---|---|
| RANGE INFORMATION | | | DESIRED RANGE |
| STEP INFORMATION | CELL PLACEMENT STEP | PLACEMENT PERMISSION | NONE |
| | | PLACEMENT PROHIBITION | ALL CELLS |
| | TIMING ADJUSTMENT STEP | PLACEMENT PERMISSION | TIMING ADJUSTMENT CELL |
| | | PLACEMENT PROHIBITION | NONE |

| PLACEMENT RESTRICTED REGION ID | | | #2 |
|---|---|---|---|
| RANGE INFORMATION | | | DESIRED RANGE |
| STEP INFORMATION | CELL PLACEMENT STEP | PLACEMENT PERMISSION | NONE |
| | | PLACEMENT PROHIBITION | ALL CELLS |
| | TIMING ADJUSTMENT STEP | PLACEMENT PERMISSION | NONE |
| | | PLACEMENT PROHIBITION | ALL CELLS |
| | COUPLING CAPACITANCE CELL PLACEMENT STEP | PLACEMENT PERMISSION | COUPLING CAPACITANCE CELL |
| | | PLACEMENT PROHIBITION | NONE |

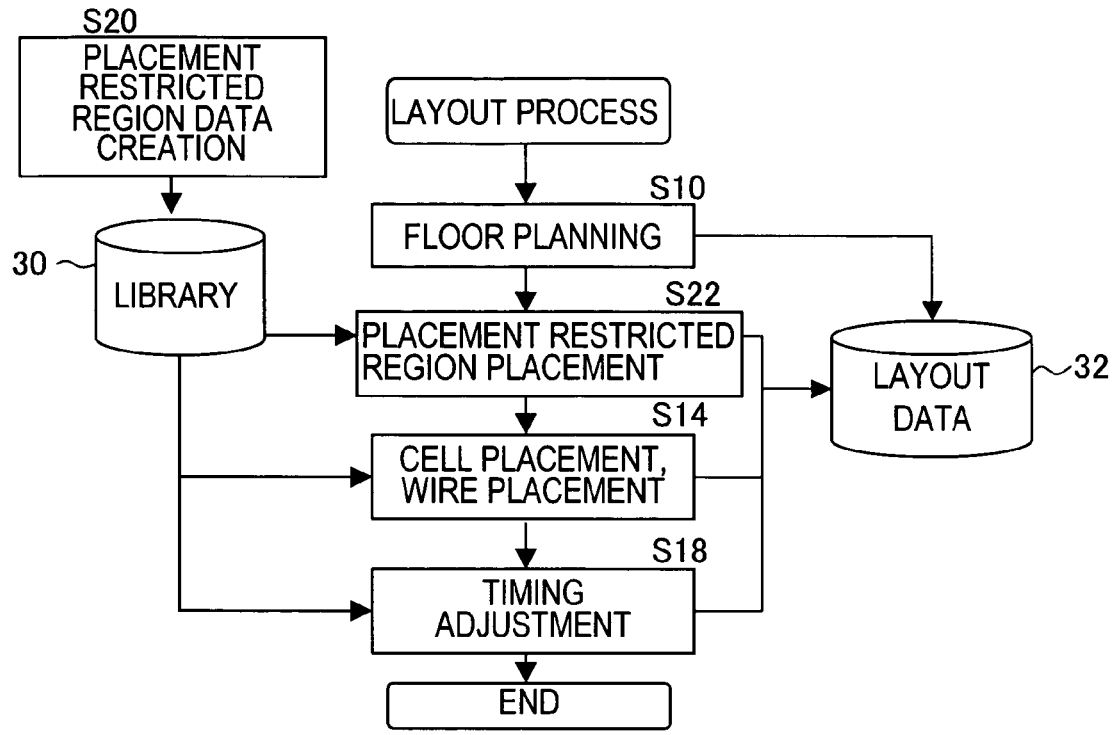
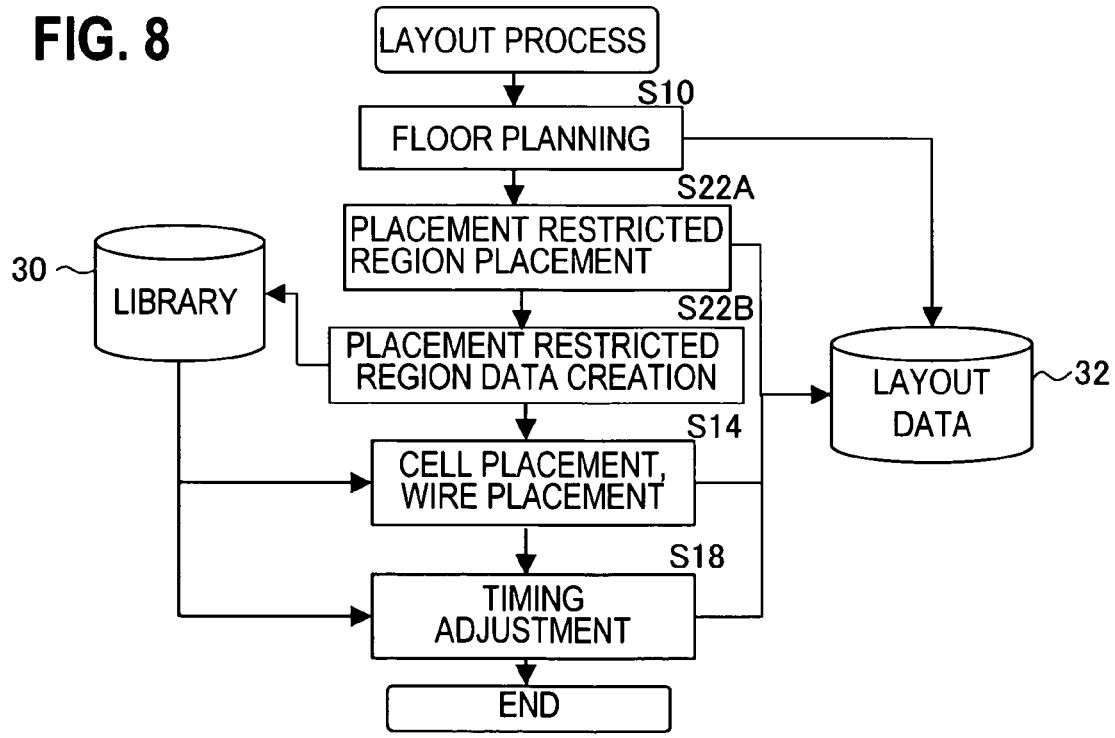

FLOOR PLANNING S10

PLACEMENT RESTRICTED REGION PLACEMENT S22

50. PLACEMENT RESTRICTED REGION #1

CELL PLACEMENT S14

TIMING ADJUSTMENT CELL PLACEMENT S18

FIG. 12A NORMAL CELL WITH ADDED PLACEMENT RESTRICTED REGION

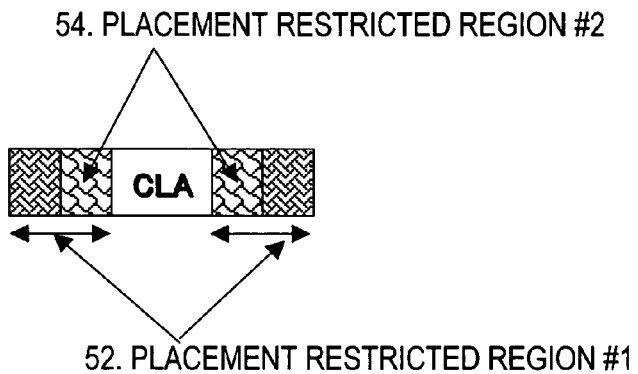

54. PLACEMENT RESTRICTED REGION #2

52. PLACEMENT RESTRICTED REGION #1

FIG. 12B EXAMPLE OF PLACEMENT RESTRICTED REGION DATA

| CELL ID | | | CELL A |
|---|---|---|---|
| PLACEMENT RESTRICTED REGION ID | | | #1 |
| RANGE INFORMATION | | | LEFT/RIGHT, WIDTH OF CELL A |
| STEP INFORMATION | NONE | PLACEMENT PERMISSION | NOT SET |
| | | PLACEMENT PROHIBITION | CELL A |
| PLACEMENT RESTRICTED REGION ID | | | #2 |
| RANGE INFORMATION | | | LEFT/RIGHT, WIDTH OF CELL C |
| STEP INFORMATION | NONE | PLACEMENT PERMISSION | CELL C |
| | | PLACEMENT PROHIBITION | NOT SET |

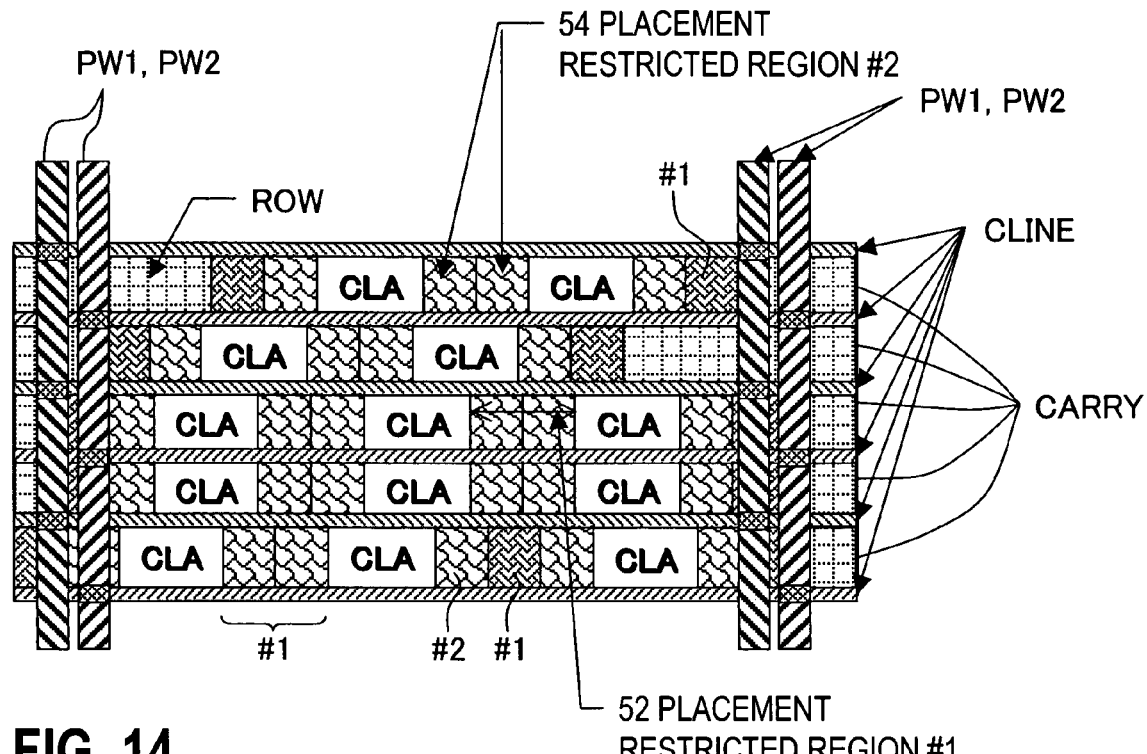
FIG. 13 EXAMPLE OF ARRANGEMENT OF CELLS A SET WITH PLACEMENT RESTRICTED REGIONS
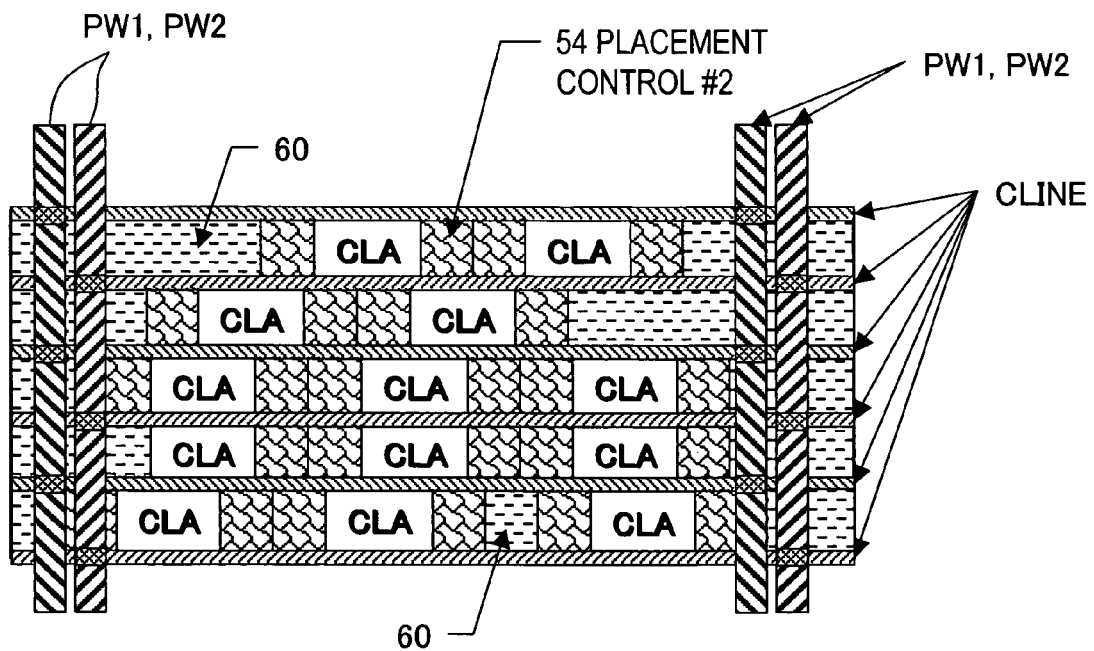
FIG. 14

LAYOUT METHOD AND LAYOUT PROGRAM FOR SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2005-262030, filed on Sep. 9, 2005, the entire contents of which are incorporated herein by reference.

BACKGROUND OF THE INVENTION

Field of the Invention

The present invention relates to a layout method and layout program for a semiconductor integrated circuit device, and more particularly to a layout method and layout program for a semiconductor integrated circuit in which cell layout can be controlled with a high degree of flexibility.

A design process for a semiconductor integrated circuit comprises a logic design process for designing a logical circuit having a predetermined function, and a layout process for laying out macros, cells, and wires connecting the macros and cells on a chip using an automatic placement and routing program, on the basis of a net list, which is logical circuit information generated during the logic design process. With the increases in scale seen in recent years, a problem has arisen in that the number of steps required in the layout process has increased.

For example, first a floor planning step is performed to arrange an input/output circuit, a logical macro, a memory macro, a cell placement region, and so on within the chip, whereupon a plurality of cells is arranged within the cell placement region, and wires are generated and arranged between the cells. In this step, arrangement of the plurality of cells and arrangement of the connecting wires between the cells are performed automatically by a computer upon execution of an automatic placement and routing program tool (a layout program). Hence, when cell arrangement is not performed appropriately, the connecting wires therebetween may become longer, leading to situations in which the surface area efficiency of the connecting wires decreases, a portion of the connecting wires cannot be laid, and the power current supplied to the crowded plurality of cells is insufficient.

In a prior art proposal for preventing such problems, a cell placement prohibited region in which cell placement is prohibited, or a cell placement prohibited region in which cell placement is prohibited from a predetermined density upward, is set during the floor planning step to ensure that cells are not disposed in the positions and regions that cause such problems (see Japanese Unexamined Patent Application Publication H11-338892, Japanese Unexamined Patent Application Publication H10-4141, Japanese Unexamined Patent Application Publication H5-190813, Japanese Unexamined Patent Application Publication H5-152437, and so on, for example).

However, the cells arranged on the chip include not only normal cells constituting the logical circuit, but also timing adjustment cells for improving the signal delay characteristic of the connecting wires, capacitor cells for moderating voltage change in the power wires, and other cell types, and the regions in which cells can and cannot be disposed vary according to the cell type. Furthermore, the regions in which cell placement is to be restricted or prohibited differ in each step of the automatic layout process. As a result, operations to dispose a cell placement prohibited region on the chip and remove a disposed cell placement prohibited region must be performed repeatedly. Such repeated performance of these operations to dispose and remove cell placement prohibited regions is complicated and leads to an increase in the number of steps in the automatic layout process, and is therefore undesirable.

SUMMARY OF THE INVENTION

It is therefore an object of the present invention to provide a layout method for an integrated circuit device which enables highly flexible cell placement control while suppressing increases in the number of steps required in the method.

To achieve this object, in a layout method for an integrated circuit device according to a first aspect of the present invention, a plurality of cells are disposed in a chip region and wires are disposed between the cells in order to connect the cells over a plurality of layout steps. The layout method comprises (1) a placement restricted region placement step for disposing, in the chip region, a placement restricted region in which placement of predetermined cell types is prohibited or permitted in accordance with different layout steps, (2) a first layout step for disposing a desired cell in the chip region in conformity with the cell types that are prohibited or permitted in accordance with the first layout step of the disposed placement restricted region, and (3) a second layout step for disposing a desired cell in the chip region in conformity with the cell types that are prohibited or permitted in accordance with the second layout step of the disposed placement restricted region.

To achieve this object, in a layout method for an integrated circuit device according to a second aspect of the present invention, a plurality of cells recorded in a library are disposed in a chip region and wires are disposed to connect the cells to each other over a plurality of layout steps. Data relating to a placement restricted region located on the periphery of the cells recorded in said library, in which the placement of predetermined cell types is prohibited or permitted, are associated with data relating to these cells, and the layout method comprises (1) a first layout step for disposing the cells recorded in the library sequentially in the chip region, and (2) a second layout step for disposing the cells recorded in the library sequentially in the chip region in conformity with the cell types that are prohibited or permitted in the placement restricted region data associated with the data relating to the disposed cells.

According to the first aspect of the invention described above, a placement restricted region in which the placement of specific cells is permitted or prohibited in accordance with different layout steps is disposed before the automatic cell placement step. As a result, cell placement positions can be restricted according to highly flexible rules, and the placement of cells in inappropriate positions can be prevented.

According to the second aspect of the invention described above, placement restricted regions on the periphery of cells recorded in a library and in which the placement of specific cells is permitted or prohibited are associated with the cells recorded in the library, and hence when a cell is disposed, the associated placement restricted region is disposed simultaneously. As a result, subsequent cell placement can be restricted, and the placement of cells in inappropriate positions can be prevented.

BRIEF DESCRIPTION OF THE DRAWINGS

FIG. 4 is a constitutional diagram of a layout device according to an embodiment of the present invention;

FIG. 5 is a view showing an example of library data;

FIG. 6 is a view showing an example of placement restricted region data;

FIG. 7 is a flowchart illustrating a layout method according to a first embodiment;

FIG. 8 is a flowchart illustrating the layout method according to the first embodiment;

FIG. 12 is a view showing normal cells and associated placement restricted regions according to a second embodiment;

FIG. 13 is a layout diagram at a point during a layout process according to the second embodiment;

FIG. 14 is a layout diagram at a point during the layout process according to the second embodiment.

DESCRIPTION OF THE PREFERRED EMBODIMENTS

Embodiments of the present invention will be described below with reference to the drawings. Note that the technical scope of the present invention is not limited to these embodiments, and encompasses matter described in the claims and equivalents thereof.

First, before describing the embodiments, a conventional layout method employing a cell placement prohibited region will be described briefly.

Figure 1:
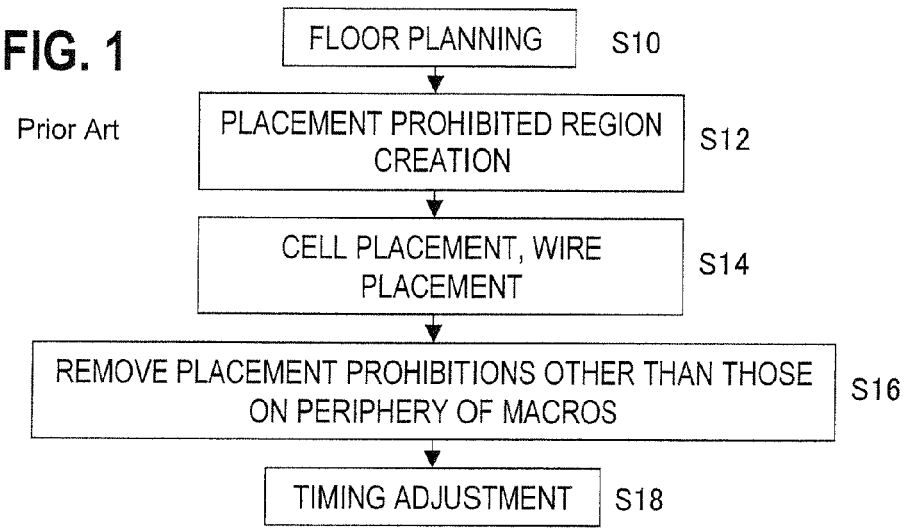
FIG. 1 is a flow chart illustrating a conventional layout method in which a cell placement prohibited region is specified.
Figure 2A:
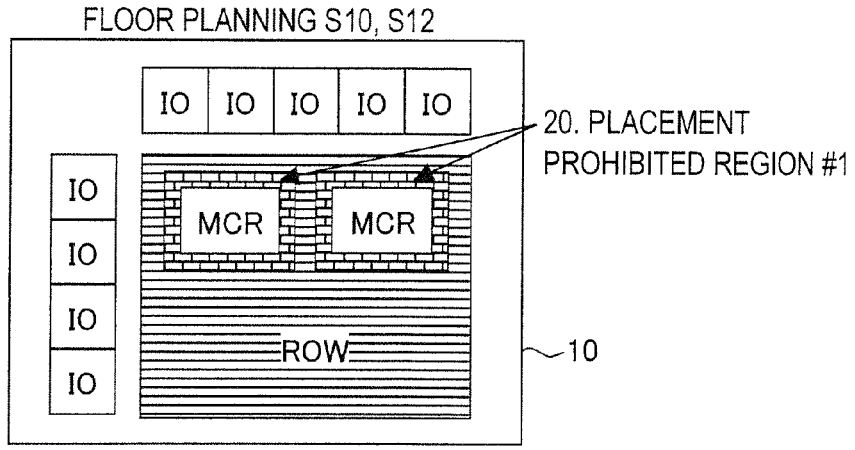
FIG. 2 is a layout diagram according to the conventional layout method in which a cell placement prohibited region is specified.

FIG. 1 is a flowchart illustrating a conventional layout method in which a cell placement prohibited region is specified. FIGS. 2 and 3 are layout diagrams according to this method. Before the beginning of the layout process, logical circuit design is completed, and a net list serving as logical circuit data is generated. As shown in FIG. 2A, in an initial floor planning step S10, a plurality of input/output macros IO, macro MCRs such as RAM or ALU, and a cell placement region ROW for laying out a plurality of cells are arranged on a chip region 10. In the example in FIG. 2A, the cell placement region ROW is specified as a region excluding the input/output macros IO and macros MCR. In this floor planning step, placement may be performed manually by an operator, or automatically on the basis of the predetermined algorithms of an automatic placement tool. The schematic arrangement of the chip region is determined in this floor planning step.

Figure 2B:
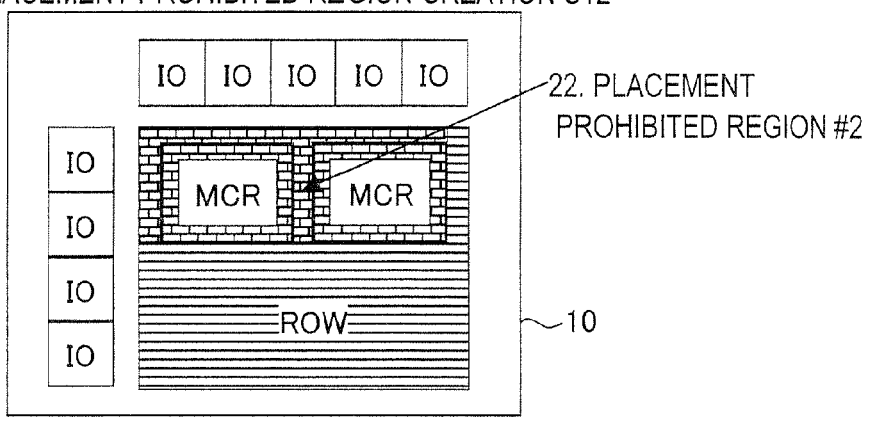

Next, in a placement prohibited region creation step S12, placement prohibited regions 20 are created at the periphery of the macros as regions in which cell placement is prohibited, as shown in FIG. 2A. Input/output ports are disposed on the peripheral edge portions of the macros, and hence the placement prohibited regions 20 are disposed in order to secure a wiring region leading to the input/output ports. Also in the placement prohibited region creation step S12, another placement prohibited region 22 is created in the region between the macros and the region between the macros MCR and input/output macros IO, as shown in FIG. 2B. If cells are disposed in these regions, the connecting wire between a cell at the lower portion of the macro MCR and a cell in the region ROW increases in length, causing a deterioration in the wiring efficiency or making it impossible to dispose the connecting wire itself.

Figure 3A:
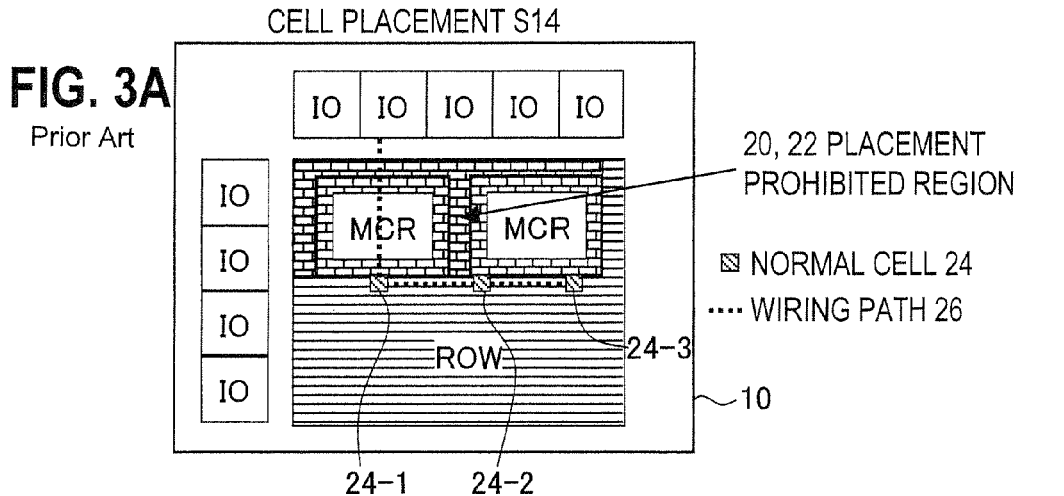
FIG. 3 is a layout diagram according to the conventional layout method in which a cell placement prohibited region is specified.

Next, in a cell placement and wire placement step S14, normal cells 24 are disposed in an area of the cell placement region ROW excluding the placement prohibited regions 20, 22, as shown in FIG. 3A. In this example, three normal cells, 24-1, 24-2, 24-3 are disposed in positions near the input/output macros IO on the upper side of the chip 10, and wiring paths 26 are laid out to connect the normal cells 24-1, 24-2, 24-3. The wiring paths 26 are logical wires, for example, rather than real wires that are actually laid out. Due to the placement prohibited regions 20, 22, normal cells are not disposed on the periphery of the macros MCR, between the macros, and between the macros MCR and the input/output macros IO.

Figure 3B:
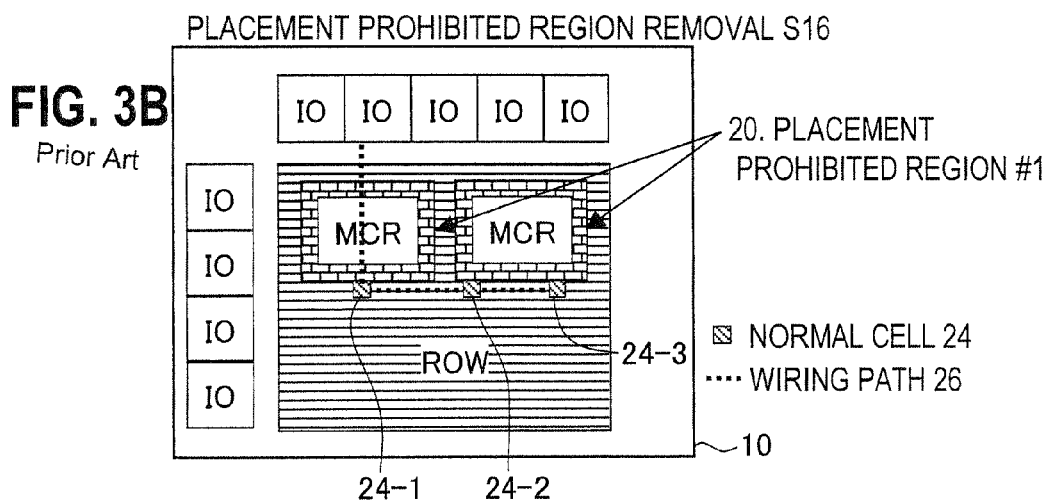
Figure 3C:
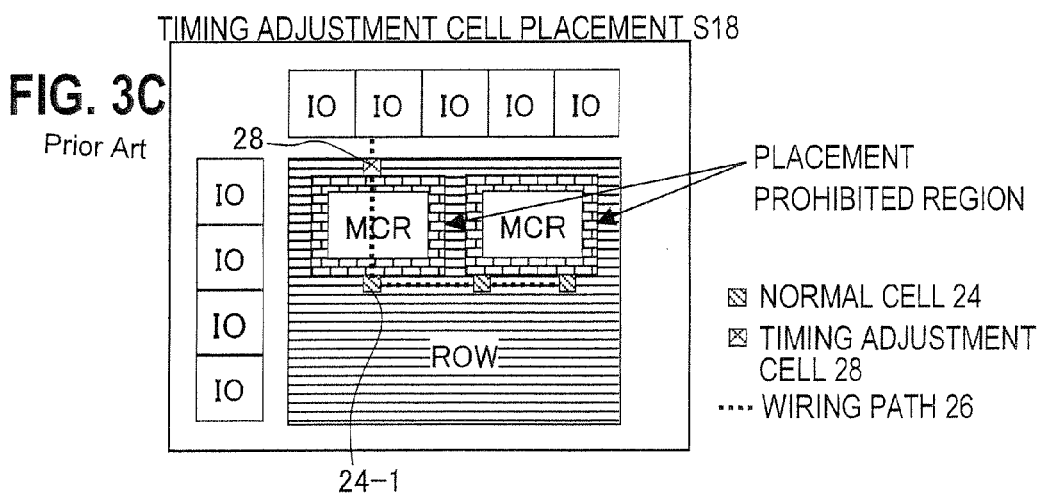

Next, the placement prohibited region 22, excluding the periphery of the macros MCR, is removed (S16). As a result, the placement prohibited regions 20 surrounding the MCRs remain, as shown in FIG. 3C. In this state, a timing adjustment step S18 is performed to determine the delay times of the wiring paths 26 in accordance with the wiring paths 26 between the cells, the cell driving capacity, and so on, and to perform a timing test on a signal transmitted along the wiring paths on the basis of the determined delay times. If a timing delay is detected during the timing test, a timing adjustment cell 28 is disposed on the appropriate wiring path. The timing adjustment cell is also disposed in the cell placement region ROW outside of the placement prohibited regions 20. In the example in FIG. 3C, the timing adjustment cell 28 is disposed between the input/output macros IO and the normal cell 24-1.

As described above, the placement prohibited regions in which cell placement is prohibited are disposed in advance, whereupon automatic cell placement is performed. In so doing, cells are prevented from being disposed in inappropriate positions. However, the regions in which cell placement is prohibited can only be specified in a uniform manner, and in order to perform different cell placement control in different steps of the layout process, the placement prohibited region 22 must be removed as shown in FIG. 3B and created as shown in FIG. 2B. This highly complicated operation cannot be automated easily, and must therefore be performed manually by an operator in most cases.

Next, an embodiment of the present invention will be described. In this embodiment, placement restricted regions in which the placement of predetermined cells is prohibited or permitted in accordance with the various layout steps of a series of layout steps are employed instead of the regions of the conventional example, in which cell placement is prohibited in a uniform manner, and as a result, cell placement control can be performed with a higher degree of flexibility.

FIG. 4 is a constitutional diagram of a layout device according to this embodiment. In this layout device, a central processing unit CPU, memory RAM, an input/output device I/O, a library 30 in which a plurality of cells is recorded, and a floor planning tool 36, cell layout tool 38, and timing adjustment tool 40, which constitute modules of a layout program, are connected via a bus 42. On the basis of a net list 34 constituted by logical circuit data generated during the logical design process, the layout device generates layout data 32 relating to the macros and cells that are arranged in the chip region and the connecting wires disposed therebetween. The functions of the respective tools 36, 38, 40 of the layout program will be described below.

FIG. 5 is a view showing an example of library data. The net list constituted by the logical circuit data comprises data relating to a plurality of cells and corresponding connecting wire data. In the layout process, the plurality of cells included in the net list are arranged within the chip region, and connecting wires connecting the cells are generated. In this case, a desired cell is selected from the plurality of cells recorded in the library 30 and disposed in the chip region, whereupon a layout data file 32 is generated. For example, data 30A for a plurality of normal cells R-CELL1 to n, data 30B for a plurality of timing adjustment cells T-CELL1 to m, and data 30C for a plurality of placement restricted regions #1 to #N are recorded in the library. The normal cell data include data relating to the circuit element, such as a transistor, constituting each cell, and the connecting wire in the cell. The timing adjustment cell is constituted by a delay circuit, a signal driving buffer, or the like, and similarly to the normal cell data, includes data relating to the transistor constituting the cell and the connecting wire in the cell. Typically, the net list 34 comprises the normal cell data and the corresponding connecting wire data, but does not comprise the timing adjustment cell data.

In this embodiment, the library 30 comprises the data 30C, which relates to placement restricted regions in which the placement of specific cells is permitted or prohibited in accordance with the different layout steps of a series of layout steps. The placement restricted region may be provided singly or in a plurality, and the placement restricted region data may be recorded in the library in advance, or generated by an operator arbitrarily during the layout process and recorded in the library.

FIG. 6 is a view showing an example of the placement restricted region data. In this embodiment, the placement restricted region is a region in which the placement of a specific cell is prohibited or permitted in accordance with different layout steps of a series of layout steps constituting a layout process. A plurality of placement restricted regions is recorded in the library in advance, or a desired placement restricted region is created and recorded in the library during layout, and following the floor planning step, the desired placement restricted region is disposed in the chip region. Automatic cell layout is then performed in the placement restricted region in conformity with the rules defined by the placement restricted region data such that in the various steps, the positions in which the desired cells are disposed or not disposed can be controlled or restricted. The placement restricted regions may be disposed so as to overlap each other partially or entirely.

The placement restricted region data shown in FIG. 6 comprise attribute data relating to a "placement restricted region ID", "range information", "step information", "placement permission", and "placement prohibition". In the example in FIG. 6, data having a placement restricted region ID of #1 have "range information" defined as "desired range" and "step information" defined as "cell placement step" and "timing adjustment step". The "placement permission" of the "cell placement step" is defined as "not specified", while the "placement prohibition" is defined as "all cells". In the "timing adjustment step", the "placement permission" is defined as "timing adjustment cell", while the "placement prohibition" is defined as "not specified". In other words, according to the placement restricted region #1, all cells are prohibited from being disposed therein during the cell placement step and no cells are specified as being permitted, while in the timing adjustment step, only timing adjustment cells may be disposed, and there is no particular specification of cells which may not be disposed. Hence, in the region defined as the placement restricted region #1, all cells are prohibited from being disposed during the cell placement step, and only timing adjustment cells may be disposed during the timing adjustment step.

Data having a placement restricted region ID of #2 have "range information" defined as "desired range" and "step information" defined as "cell placement step", "timing adjustment step", and "coupling capacitance cell placement step". The "placement permission" of the "cell placement step" is defined as "not specified", while the "placement prohibition" is defined as "all cells". In the "timing adjustment step", the "placement permission" is defined as "not specified", while the "placement prohibition" is defined as "all cells". In the "coupling capacitance cell placement step", the "placement permission" is defined as "coupling capacitance cell", while the "placement prohibition" is defined as "not specified". In other words, according to the placement restricted region #2, all cells are prohibited from being disposed therein during the cell placement step and timing adjustment step, and only coupling capacitance cells may be disposed during the coupling capacitance cell placement step. Accordingly, only coupling capacitance cells can be disposed within the region.

Note that the coupling capacitance cells are not included in a typical net list, but by disposing a coupling capacitance cell in an available region during the final step of the layout process, power supply noise can be suppressed.

As described above, by defining the specifiable range of the placement restricted region as the "range information", and defining cell types that can be disposed and cell types that cannot be disposed in accordance with the various steps, the cell placement positions can be controlled or restricted flexibly in accordance with the different steps of the series of layout steps.

FIG. 7 is a flowchart illustrating a layout method according to a first embodiment. FIG. 8 is a modified example thereof. FIGS. 9 and 10 are layout diagrams of a chip region laid out according to this layout method.

First, a layout method according to this embodiment will be described using the flowchart in FIG. 7 and with reference to FIGS. 9 and 10. Prior to the layout process, the placement restricted region data are created and recorded in the library 30 (S20). The placement restricted region data are constituted as described above with reference to FIG. 6. The data in the library 30 are constituted as described above with reference to FIG. 5.

Figure 9A:
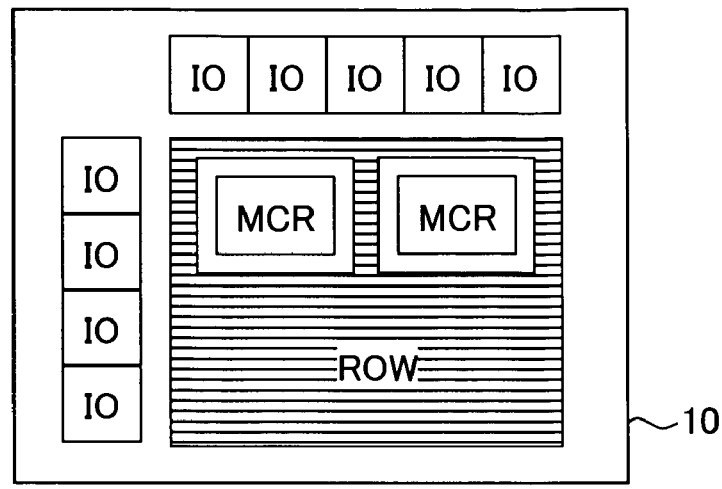
FIG. 9 is a layout diagram of a chip region laid out in accordance with the layout method of the first embodiment.
Figure 9B:
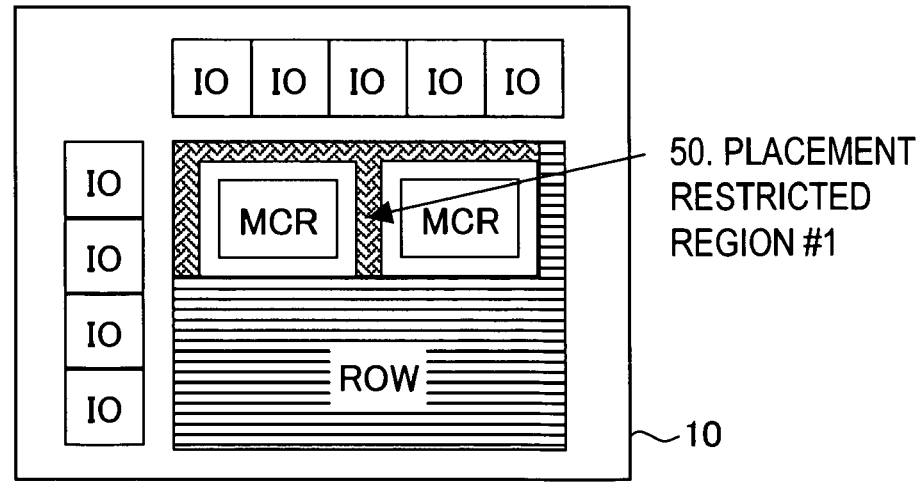

In the layout process, first the floor planning step S10 is performed. FIG. 9A shows the chip region 10 arranged in accordance with the floor planning step. Input/output macros IO are disposed on the periphery, two macros MCR constituted by logical circuits, memory, or the like are disposed, and the cell placement region ROW occupies the remaining positions. An arbitrary placement restricted region recorded in the library 30 is disposed in the chip region 10 (S22). As a result, the data of the disposed placement restricted region are reflected in the layout data 32. As shown in FIG. 9B, for example, the placement restricted region #1 (50) is disposed between the macros MCR and between the macros MCR and input/output macros IO. The placement restricted region #1 is constituted as described above with reference to FIG. 6. In this example, only one placement restricted region 50 is disposed, but a plurality of placement restricted regions may be disposed either exclusively or partially overlapping.

Figure 10A:
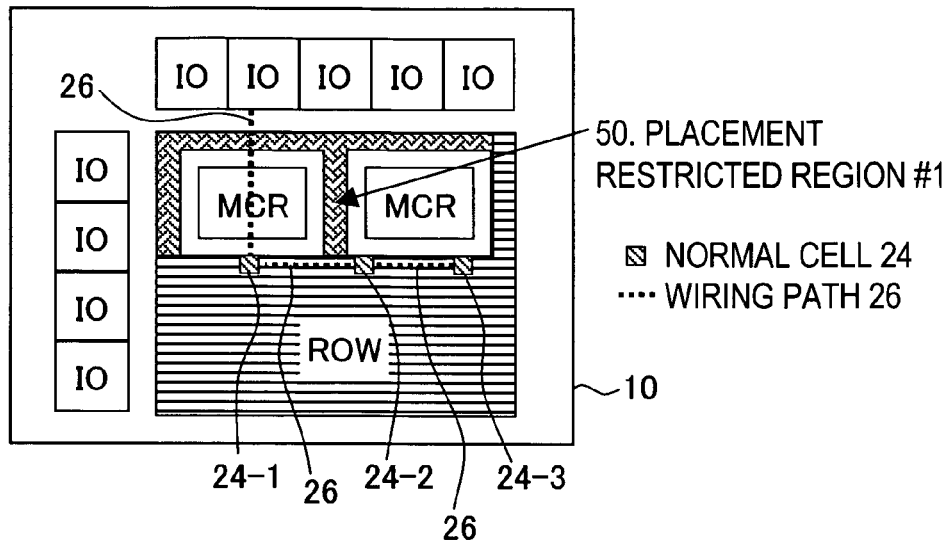
FIG. 10 is a layout diagram of a chip region laid out in accordance with the layout method of the first embodiment.

Once the placement restricted region has been specified, the cell placement and wire placement step S14 and the timing adjustment step S18 are executed. As shown in FIG. 10A, in the cell placement and wire placement step S14, no cells can be disposed in the placement restricted region 50, and therefore the normal cells 24-1, 24-2, 24-3 of the net list are arranged in the cell placement region ROW outside of the placement restricted region 50. Connecting wires 26 connecting these cells are also disposed. In this manner, cell placement can be controlled or restricted such that the normal cells of the net list are not disposed in the region between the macros MCR and the region between the macros MCR and input/output macros IO.

Figure 10B:
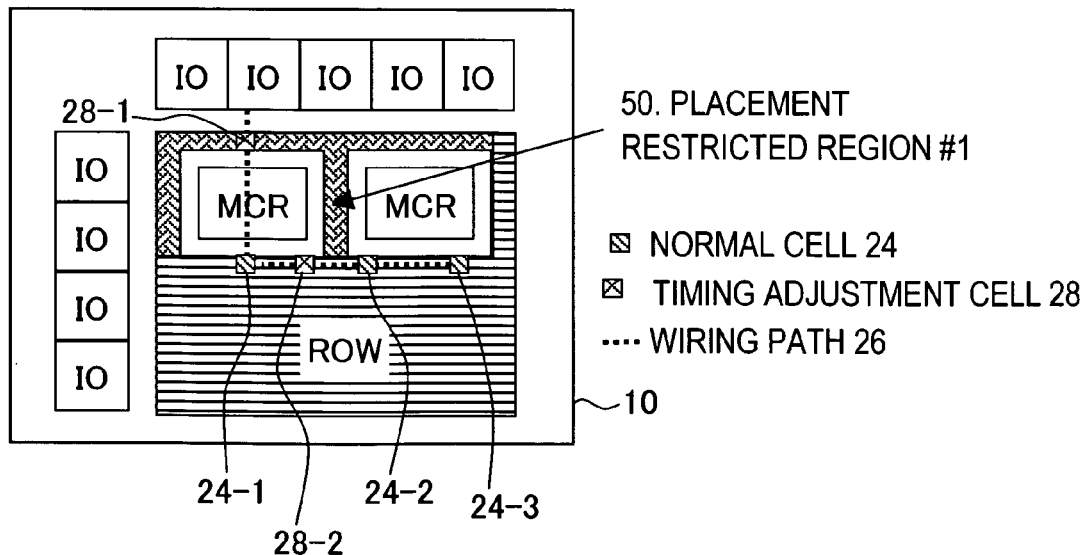

Next, in the timing adjustment step S18, the delay time of each connecting wire is determined and a timing test is performed. When it is determined as a result of the timing test that the timing is inappropriate, a timing adjustment cell 28 is disposed at a point on the corresponding connecting wire. In the timing adjustment step, only timing adjustment cells may be disposed in the placement restricted region 50, and therefore, as shown in FIG. 10B, a timing adjustment cell 28-1 is disposed in the placement restricted region 50, and another timing adjustment cell 28-2 is disposed in the cell placement region ROW. Timing adjustment cells are used to adjust the timing by delaying the timing of a signal that is transmitted along the connecting wire, and are not typically included in the net list.

Thus in the layout steps S14, S18, the automatic layout tools 38, 40 refer to the position and attribute data of the placement restricted region, which are reflected in the layout data file 32, and perform automatic placement in conformity with these data such that prohibited cells are not disposed and permitted cells are disposed. When the placement restricted region data are used in this manner, the need to perform complicated processing such as that of the prior art repeatedly in order to generate and remove cell placement prohibited regions is eliminated. Moreover, by defining a plurality of placement restricted region types, recording these in the library, and then disposing the desired placement restricted region, cell placement can be controlled or restricted with a high degree of flexibility, enabling an improvement in the user-friendliness of the layout process.

In FIG. 8, a placement restricted region placement step S22A and a step S22B for creating the data thereof and recording the created data in the library are performed during the layout process. More specifically, an operator may create a desired placement restricted region other than the placement restricted regions recorded in the library 30 in advance, dispose the created placement restricted region in the chip region, and record the created placement restricted region in the library 30. By enabling customization of the placement restricted regions in this manner, the operator can be afforded a greater degree of convenience. In FIG. 8, the cell placement and wire placement step S14 and the timing adjustment step S18 are identical to those of FIG. 7.

[Second Embodiment]

Figure 11:
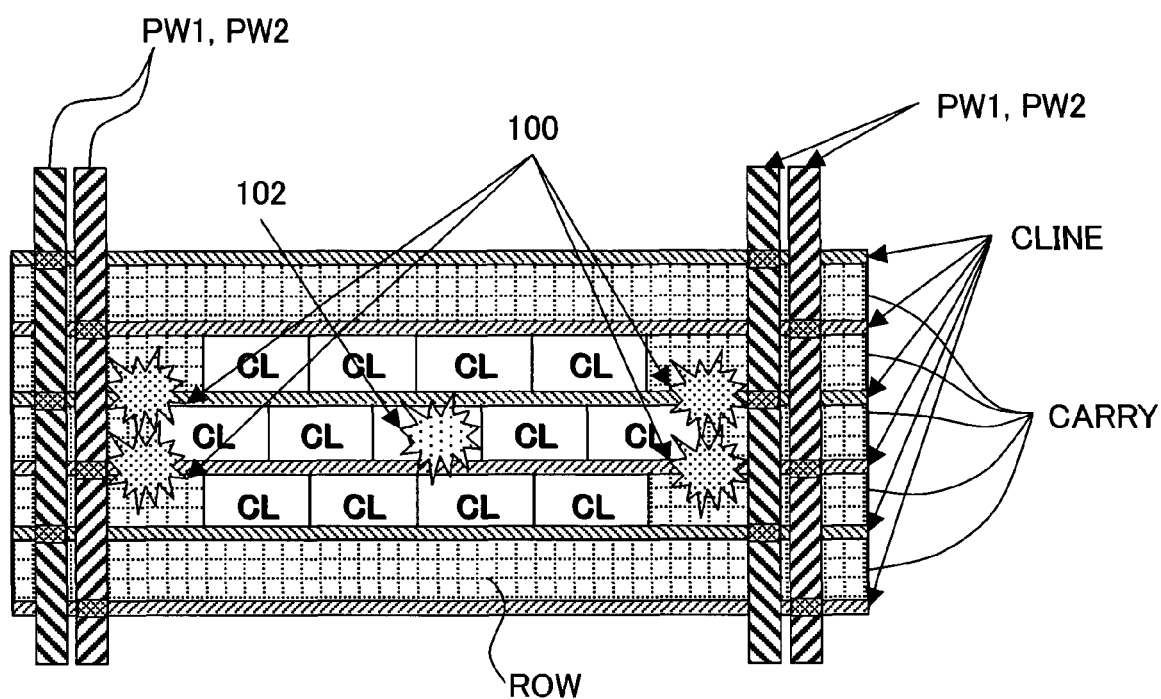
FIG. 11 is a view showing problems arising when cells are arranged in concentrated fashion.

FIG. 11 is a view illustrating problems arising when cells are disposed in a concentrated fashion. Within the cell placement region ROW, power lines PW1, PW2 (at ground potential and power source potential) extending in a vertical direction are disposed at a predetermined distance from each other, while cell array regions CARRY in which cells are arranged and wiring regions CLINE for connecting the cells to each other are disposed in the horizontal direction. In the example in FIG. 11, twelve cells CL are arranged in concentrated fashion in the central region. When a plurality of cells are arranged in such a concentrated fashion (102 in the drawing), the density of the wires connecting the cells increases excessively to the extent that the required wires cannot be disposed.

Moreover, the consumption current supplied to the concentrated cells may exceed the current capacity of the power lines for supplying the cells with power, leading to problems in a region 100 such as a current density violation in the power lines and an increase in power source noise accompanying the increase in consumption current. Conventionally, when cells are disposed in such a concentrated fashion, the operator must re-distribute the cells manually, for example, and as a result, the number of layout steps increases.

FIG. 12 is a view showing a normal cell and an associated placement restricted region according to the second embodiment. In the second embodiment, as shown in FIG. 12A, placement restricted regions 52, 54 are disposed in peripheral regions (the left and right sides in the drawing) where cells may be disposed. More specifically, the placement restricted regions 52, 54 are disposed on the periphery of, and particularly adjacent to, normal cells CLA. In other words, the placement restricted region data are associated with the normal cell data such that placement restricted regions are disposed on the left and right side regions of each normal cell. In the example in FIG. 12A, the placement restricted region (#2) 54 is disposed on the left and right sides of the cell CLA, and the placement restricted region (#1) 52 is disposed in a larger region encompassing the placement restricted region (#2) 54 on the left and right sides of the cell CLA.

FIG. 12B shows an example of the data relating to the two placement restricted regions #1, #2. These placement restricted region data also comprise a "placement restricted region ID", "range information", "step information", "placement permission", and "placement prohibition", similarly to the placement restricted region data described above. A cell ID of the associated cell is also included. In the example in FIG. 12B, the placement restricted regions #1 and #2 are associated with a cell A (cell ID). The placement restricted region #1 is set with "cell A width on left and right sides of cell" as the "range information", "not specified" as the "step information", "not specified" as the "placement permission", and "cell A" as the "placement prohibition". Hence, placement of the cell A in the placement restricted region #1 is prohibited in all of the layout steps. As a result, once the cell A has been disposed, an identical cell A cannot be disposed in regions on either side of, and having the same width as, the cell A. When the cell A is a clock buffer, flip-flop, or another cell which operates in synchronization with a clock, the consumption current becomes concentrated if an identical cell A is disposed adjacent to the cell A, and therefore, by associating the placement restricted region #1 with both sides of the cell A, cell placement can be controlled or restricted to prevent an identical cell A from being disposed adjacent to the cell A.

The placement restricted region #2 is set with "cell C width on left and right sides of cell" as the "range information", "not specified" as the "step information", "cell C" as the "placement permission", and "not set" as the "placement prohibition". Hence, placement of a cell C in the placement restricted region #2 is permitted in all of the layout steps. The cell C is a decoupling capacitance cell provided between the power lines, for example. By providing a decoupling capacitance cell, variation in the power source potential caused by the consumption current and accompanying an operation of the cell A can be suppressed. When the cell A operates in clock synchronization, power source noise can be suppressed by securing a decoupling capacitance cell placement region in the vicinity of the input/output terminals of the cell A.

The layout process of the second embodiment is identical to that illustrated in FIGS. 7 and 8. Note, however, that in the second embodiment, a specific placement restricted region is added to a specific cell, and hence, when a specific cell is disposed, the associated placement restricted region is disposed simultaneously.

Figure 15:
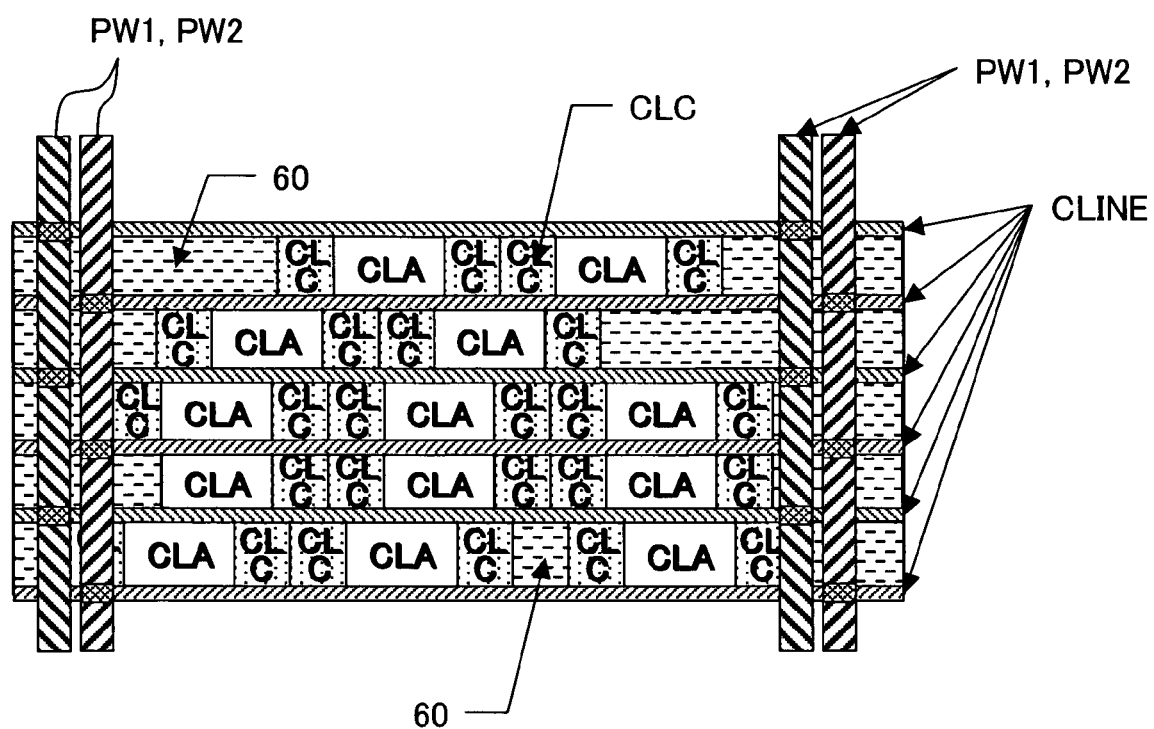
FIG. 15 is a layout diagram at a point during the layout process according to the second embodiment.

FIGS. 13, 14, and 15 are layout diagrams at points during the layout process according to the second embodiment. In the cell placement step S14 of the flowcharts in FIGS. 7 and 8, the cells on the net list are subjected in sequence to automatic placement. In FIG. 13, the cells A (CLA) are arranged in the cell array region CARRY. As described with reference to FIG. 12, the placement restricted region #1 prohibiting placement of the cell A is disposed on both the left and right sides of the cells A (CLA) in a magnitude corresponding to the width of the cell A, and therefore an identical cell A (CLA) is never disposed on the two sides of the cell A (CLA). More specifically, in FIG. 13, when the automatic cell layout tool disposes a single cell A (CLA), the related placement restricted region data are reflected in the layout data. Hence, during automatic placement of the next cell A, the placement of another cell A is prohibited in the placement restricted regions #1 on the left and right sides of the originally disposed cell A, and therefore the cell A is automatically disposed outside of this region. As a result, the plurality of cells A are disposed on either side of the placement restricted regions #1 such that the density and number of the cells A can be controlled or restricted to the desired density and number.

Next, in FIG. 14, other cells 60 are disposed. Only the cell A is prohibited from being disposed in the placement restricted region #1 on either side of the cell A, whereas placement of the other cell 60 is permitted. Meanwhile, only the cell C can be disposed in the placement restricted region #2 on either side of the cell A, whereas placement of the other cell 60 is prohibited. Hence, the other cells 60 are disposed in regions within the placement restricted regions #1 and outside of the placement restricted regions #2 in FIG. 13.

Finally, the cells C (CLC) are disposed in FIG. 15. In this case, only the cell C (CLC) can be disposed in the placement restricted region #2, and therefore the cells C (CLC) are disposed in the placement restricted region #2. As a result, many cells C (CLC) are disposed on either side of the cells A (CLA). If the cell C is a decoupling capacitance cell, power source noise caused by the clock synchronous operation of the cell A can be suppressed. Decoupling capacitance cells are not typically included in the net list.

By associating the placement restricted region data with the cell data such that a placement restricted region is disposed in the vicinity of the cell as described above, the placement restricted region can be disposed at the same time as the cell, and subsequent cell placement can be controlled or restricted.

In the second embodiment, the "placement permission" and "placement prohibition" of the placement restricted region data are not set in accordance with the step information, but the "placement permission" and "placement prohibition" may be set in accordance with the step information, similarly to the first embodiment.

The range of the placement restricted region #1 disposed on either side of the cell is set on the basis of a maximum cell density and cell number, which are determined according to the consumption current that can be supplied by the power lines PW1, PW2 and the distance between the power lines. By increasing the range, the density of the disposed cells and the number of disposed cells can be reduced. Conversely, by decreasing the range, the cell density and cell number can be increased.

What is claimed is:

1. A layout method for an integrated circuit device in which, through a plurality of layout steps, a plurality of cells are disposed in a chip region and wires are disposed to connect said cells to each other, said cells including a normal cell and a timing adjustment cell, said layout method comprising:
   a placement restricted region placement step for disposing, using a microprocessor, in said chip region, a placement restricted region having a first rule of a first layout step in which placement of normal cell type is prohibited in said first layout step, and having a second rule of a second layout step, in which placement of timing adjustment cell type is permitted in said second layout step, said first and second layout steps being carried out later;
   the first layout step for disposing normal cells included in logical design data, in said chip region in conformity with said normal cell type that is prohibited in accordance with said first rule defined in said disposed placement restricted region; and
   the second layout step for disposing timing adjustment cells on a wire connecting between said normal cells to adjust a timing of a signal that is transmitted along said wire, in said chip region in conformity with said timing adjustment cell type that is permitted in accordance with said second rule defined in said disposed placement restricted region.

2. The layout method for an integrated circuit device according to claim 1, wherein, in said placement restricted region placement step, a desired placement restricted region is selected from a plurality of placement restricted regions registered in a library in advance, and said selected placement restricted region is disposed in said chip region.

3. The layout method for an integrated circuit device according to claim 1, wherein, in said placement restricted region placement step, a new placement restricted region is registered in a library, and said new placement restricted region is disposed in said chip region.

4. A layout program, recorded in a non-transitory computer-readable medium, for an integrated circuit device in which, through a plurality of layout steps, a plurality of cells are disposed in a chip region and wires are disposed to connect said cells to each other, said cells including a normal cell and a timing adjustment cell, said layout program causing a computer to execute:
   a placement restricted region placement step for associating a placement restricted region having a first rule of a first layout step, in which placement of normal cell type is prohibited in said first layout step and having a second rule of a second layout step, in which placement of timing adjustment cell type is permitted in said second layout step, with layout data in response to a placement of said placement restricted region in said chip region, said first and second layout steps being carried out later;
   the first layout step for disposing normal cells included in logical design data, in said chip region in conformity with said normal cell type that is prohibited in accordance with said first rule defined in said disposed placement restricted region; and
   the second layout step for disposing timing adjustment cells on a wire connecting between said normal cells to adjust a timing of a signal that is transmitted along said wire, in said chip region in conformity with said timing adjustment cell type that is permitted in accordance with said second rule defined in said disposed placement restricted region.

* * * * *